(12) United States Patent
Levy et al.

(10) Patent No.: US 12,046,633 B2
(45) Date of Patent: Jul. 23, 2024

(54) AIRGAP STRUCTURES IN AUTO-DOPED REGION UNDER ONE OR MORE TRANSISTORS

(71) Applicant: GLOBALFOUNDRIES U.S. Inc., Santa Clara, CA (US)

(72) Inventors: Mark D. Levy, Williston, VT (US); Siva P. Adusumilli, South Burlington, VT (US); Johnatan A. Kantarovsky, South Burlington, VT (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 569 days.

(21) Appl. No.: 17/157,269

(22) Filed: Jan. 25, 2021

(65) Prior Publication Data

US 2022/0238646 A1    Jul. 28, 2022

(51) Int. Cl.

| | |
|---|---|
| *H01L 29/06* | (2006.01) |
| *H01L 21/308* | (2006.01) |
| *H01L 21/764* | (2006.01) |
| *H01L 27/06* | (2006.01) |
| *H01L 27/07* | (2006.01) |
| *H01L 29/08* | (2006.01) |

(52) U.S. Cl.
CPC ........ *H01L 29/0657* (2013.01); *H01L 21/308* (2013.01); *H01L 21/764* (2013.01); *H01L 27/0635* (2013.01); *H01L 27/0755* (2013.01); *H01L 29/0653* (2013.01); *H01L 29/0821* (2013.01)

(58) Field of Classification Search
CPC combination set(s) only.
See application file for complete search history.

(56) References Cited

U.S. PATENT DOCUMENTS

| | | | |
|---|---|---|---|
| 6,297,119 B1 * | 10/2001 | Tsutsui | H01L 27/0623 257/E21.612 |
| 6,365,447 B1 | 4/2002 | Hebert et al. | |
| 7,303,968 B2 | 12/2007 | Dunn et al. | |
| 7,936,041 B2 | 5/2011 | Johnson et al. | |
| 10,388,728 B1 * | 8/2019 | Zierak | H01L 29/0649 |
| 10,446,643 B2 | 10/2019 | Adusumilli et al. | |
| 2011/0127615 A1 * | 6/2011 | Tanaka | H01L 29/66272 438/234 |

(Continued)

OTHER PUBLICATIONS

Specification and Drawings for U.S. Appl. No. 16/807,453, filed Mar. 3, 2020, 19 pages.

(Continued)

*Primary Examiner* — Mark W Tornow
*Assistant Examiner* — Priya M Rampersaud
(74) *Attorney, Agent, or Firm* — Anthony Canale; Andrew M. Calderon; Calderon Safran & Wright, PC

(57) ABSTRACT

The present disclosure relates to semiconductor structures and, more particularly, to airgap structures in a doped region under one or more transistors and methods of manufacture. The structure includes: a semiconductor material comprising a doped region; one or more sealed airgap structures breaking up the doped region of the semiconductor material; and a field effect transistor over the one or more sealed airgap structures and the semiconductor material.

20 Claims, 10 Drawing Sheets

(56) References Cited

U.S. PATENT DOCUMENTS

| | | | |
|---|---|---|---|
| 2015/0145043 A1* | 5/2015 | Huang | H01L 23/552 |
| | | | 257/347 |
| 2016/0071925 A1* | 3/2016 | Jaffe | H01L 29/66757 |
| | | | 438/295 |
| 2017/0170056 A1* | 6/2017 | Jaffe | H01L 29/66651 |
| 2018/0166324 A1* | 6/2018 | Schaeffer | H01L 21/02592 |
| 2019/0013382 A1* | 1/2019 | Stamper | H01L 21/764 |
| 2019/0139819 A1 | 5/2019 | Jaffe et al. | |
| 2019/0229185 A1* | 7/2019 | Adusumilli | H01L 29/0653 |
| 2019/0312142 A1* | 10/2019 | Adusumilli | H01L 21/3247 |
| 2020/0219760 A1 | 7/2020 | Kantarovsky et al. | |
| 2021/0091180 A1 | 3/2021 | Pekarik et al. | |
| 2021/0257454 A1 | 8/2021 | Adusumilli et al. | |

OTHER PUBLICATIONS

Search Report in related EP Application No. 22200004.4-1211 / 4254476 dated Sep. 13, 2023, 8 pages.

\* cited by examiner

AIRGAP STRUCTURES IN AUTO-DOPED REGION UNDER ONE OR MORE TRANSISTORS

FIELD OF THE INVENTION

The present disclosure relates to semiconductor structures and, more particularly, to airgap structures in an auto-doped region of semiconductor material under one or more transistors and methods of manufacture.

BACKGROUND

Semiconductor chips can be fabricated with many different devices within an active area. For example, RF CMOS devices can be manufactured on a same chip as bipolar junction transistors (BJT). The bipolar junction transistors can include both high performance and high breakdown devices. However, the manufacturing processes of one device may degrade the performance of another device on the same chip. For example, the manufacturing processes of a high breakdown bipolar junction transistor device may degrade the performance of a RF CMOS device.

More specifically, in manufacturing of bipolar junction transistors and, more specifically, high breakdown NPN bipolar junction transistors, it is necessary to form a sub-collector region within the substrate. The sub-collector region is an n-well that can auto-dope epitaxial semiconductor material grown over a substrate material during the growth process. The epitaxial semiconductor material serves as a collector region for the NPN bipolar junction transistor, as well as a channel region and source/drain region for the RF devices. The auto-doped semiconductor material under the RF devices, though, degrades RF performance of the RF CMOS devices on the same wafer. To compensate for this performance degradation, isolation between the channel and source/drain regions of the RF devices and the auto-doped epitaxial semiconductor material is needed.

SUMMARY

In an aspect of the disclosure, a structure comprises: a semiconductor material comprising a doped region; one or more sealed airgap structures breaking up the doped region of the semiconductor material; and a field effect transistor over the one or more sealed airgap structures and the semiconductor material.

In an aspect of the disclosure, a structure comprises: a bipolar junction transistor comprising at least a sub-collector within an underlying substrate; a semiconductor material over the sub-collector, the semiconductor material having a doped region; an active device over the semiconductor material; and at least one airgap structure below the active device and within the doped region of the semiconductor material.

In an aspect of the disclosure, a method comprises: forming a semiconductor material comprising a doped region; forming one or more sealed airgap structures breaking up the doped region of the semiconductor material; and forming a field effect transistor over the one or more sealed airgap structures and the semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to airgap structures in an auto-doped region of semiconductor material under one or more transistors and methods of manufacture. In more specific embodiments, the airgap structures are provided in an auto-doped region of an epitaxial semiconductor material beneath one or more radio frequency (RF) devices, e.g., field effect transistor (FET), amongst other features. Advantageously, the airgap structures break up or eliminate the auto-doped region to increase RF isolation and, hence, improve RF switching performance.

In embodiments, the airgap structures are beneath RF CMOS devices in an auto-doped region of an epitaxial semiconductor material. The auto-doped region results from use of an n-type well (sub-collector) underneath the epitaxial semiconductor material used with high breakdown NPN bipolar junction transistors. The airgap structures can be continuous or discontinuous below the RF CMOS devices, i.e., FETs, and can be strategically placed to remove the auto-doped region, i.e., doped epitaxial semiconductor material, or to disrupt the auto-doped region under the RF devices, hence improving RF isolation. An amorphous layer of semiconductor material or polysilicon material can be provided between the airgap structures and the RF CMOS devices to further improve isolation of the RF devices. Accordingly, it is now possible to use FETs with improved switching isolation on a same substrate with high breakdown NPNs, amongst other devices.

The semiconductor structures of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structures of the present disclosure have been adopted from integrated circuit (IC) technology. For example, the structures are built on wafers and are realized in films of material patterned by photolithographic processes on the top of a wafer. In particular, the fabrication of the semiconductor structures uses three basic building blocks: (i) deposition of thin films of material on a substrate, (ii) applying a patterned mask on top of the films by photolithographic imaging, and (iii) etching the films selectively to the mask.

Figure 1:
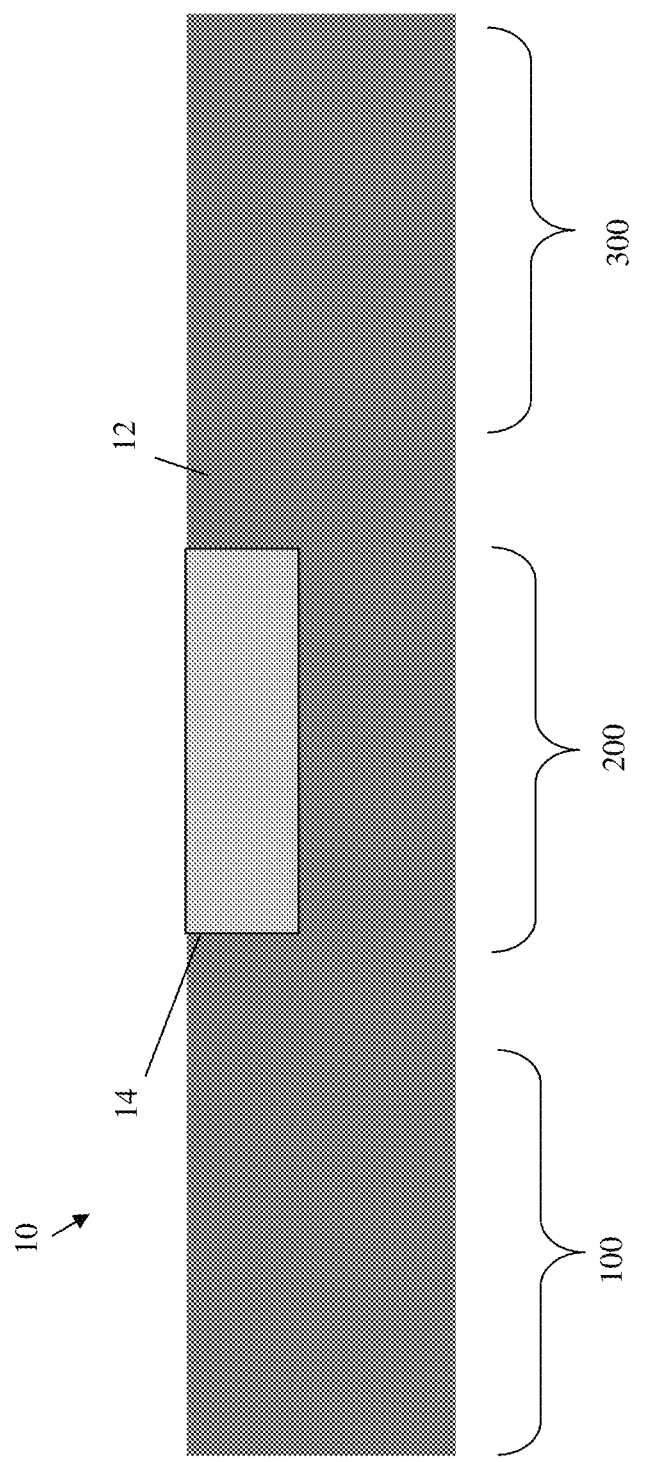
FIG. 1 shows a substrate with an n-well region, amongst other features, and respective fabrication processes in accordance with aspects of the present disclosure.

FIG. 1 shows a substrate, amongst other features, and respective fabrication processes. In the structure 10 of FIG. 1, the substrate 12 comprises a bulk semiconductor material, preferably composed of single crystalline Si material. In embodiments, the substrate 12 may be composed of other suitable bulk substrate materials including, but not limited to, elementary semiconducting materials such as germanium in crystal, silicon carbide, silicon germanium, gallium arsenic, gallium phosphide, indium phosphide, indium arsenide, and/or indium antimonide, etc. In preferred embodiments, the substrate 12 comprises any suitable crystallographic orientation (e.g., a (100), (110), (111), or (001) crystallographic orientation).

The substrate 12 includes three regions: a high performance NPN transistor region 100; a high breakdown NPN transistor region 200; and a RF transistor region 300. As should be understood by those of skill in the art, and described in more detail herein, the high performance NPN transistor region 100 includes one or more high performance NPN bipolar junction transistors, the high breakdown NPN transistor region 200 includes one or more high breakdown NPN bipolar junction transistors, and the RF transistor region 300 includes one or more RF CMOS devices, e.g., FET. Moreover, it should be understood by those of ordinary skill in the art that other regions or combinations of regions are contemplated herein.

Still referring to FIG. 1, a well 14 can be formed in the substrate 12. In embodiments, the well 14 can be an n-well used as a sub-collector for one or more high breakdown NPN bipolar junction transistors in the high breakdown NPN transistor region 200. In embodiments, the n-well 14 may be formed by introducing a dopant, e.g., Arsenic (As), Phosphorus (P) or Antimony (Sb), among other suitable examples, by ion implantation in the substrate 12. For the n-well 14, the dopant can be implanted through an opening of an implant mask. The dopant can be activated by an annealing process as is known to those of skill in the art such that no further explanation is required for a complete understanding of the present disclosure. The implant mask can be stripped after the ion implantation process.

In embodiments, the implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

Figure 2:
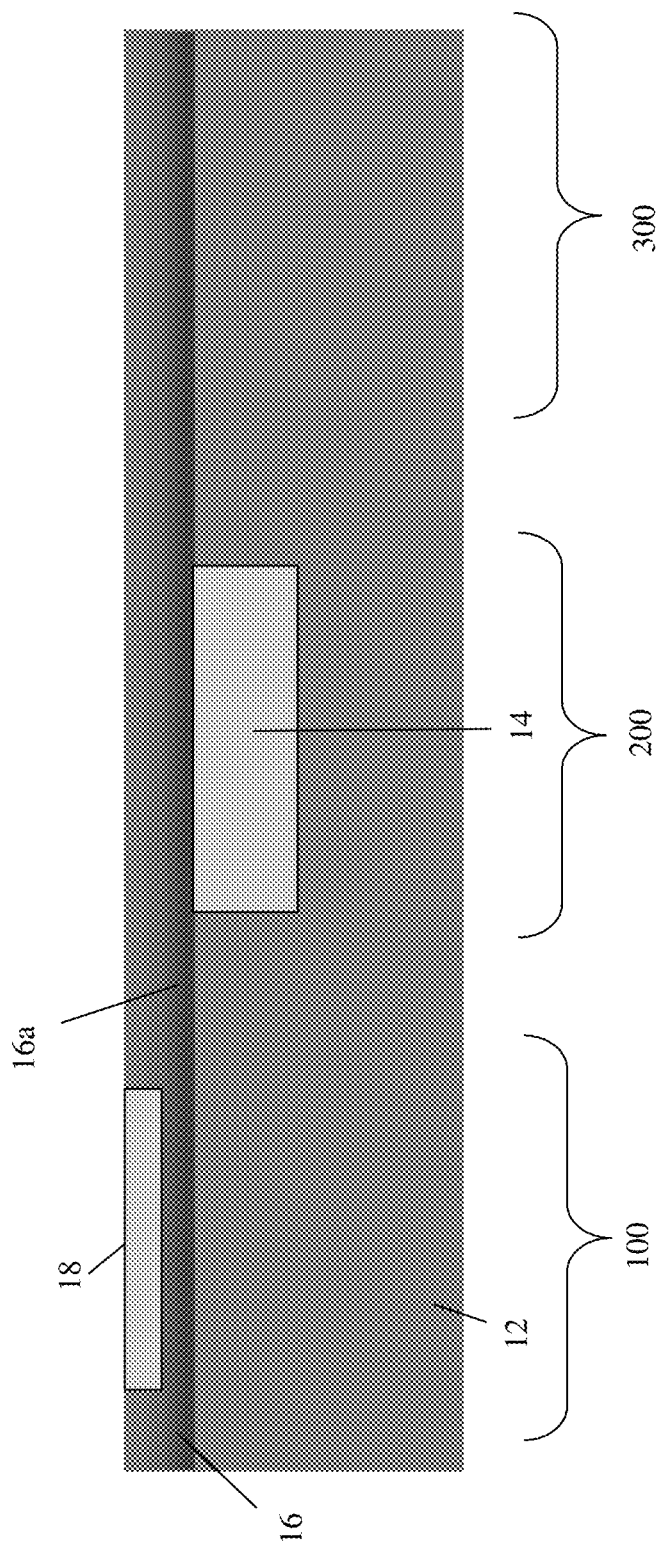
FIG. 2 shows an auto-doped semiconductor material, amongst other features, and respective fabrication processes in accordance with aspects of the present disclosure.

FIG. 2 shows a semiconductor material 16 formed over the substrate 12 and the n-well 14. In embodiments, the semiconductor material 16 can be Si material epitaxially grown on the substrate 12 and over the n-well 14. In embodiments, the dopant of the n-well 14, e.g., As, auto-dopes the semiconductor material 16 as represented by reference numeral 16a. As an illustrative example of auto-doping, during the growth process of the semiconductor material 16, the dopant atoms of the n-well 14, e.g., As, can (i) diffuse to the top surface of the substrate 12, (ii) evaporate from the surface in a gas phase, (iii) mass transport in the gas phase, and (iv) be adsorbed or incorporated into the growing layer, e.g., semiconductor material 16.

In optional embodiments, an n-well 18 can be formed in the semiconductor material 16, in the high performance NPN transistor region 100. In embodiments, the n-well 18 can be used as a sub-collector for one or more high performance NPN bipolar junction transistors. It should be recognized that the n-well 18 can be implanted in a similar manner as the n-well 14 described above; however, the n-well 18 can be provided at a lower dose to remain within the semiconductor material 16 and to avoid or minimize the auto-doping phenomena. In embodiments, the n-well 18 can also be closer to the surface of the semiconductor material 16 than the n-well 14.

Figure 3:
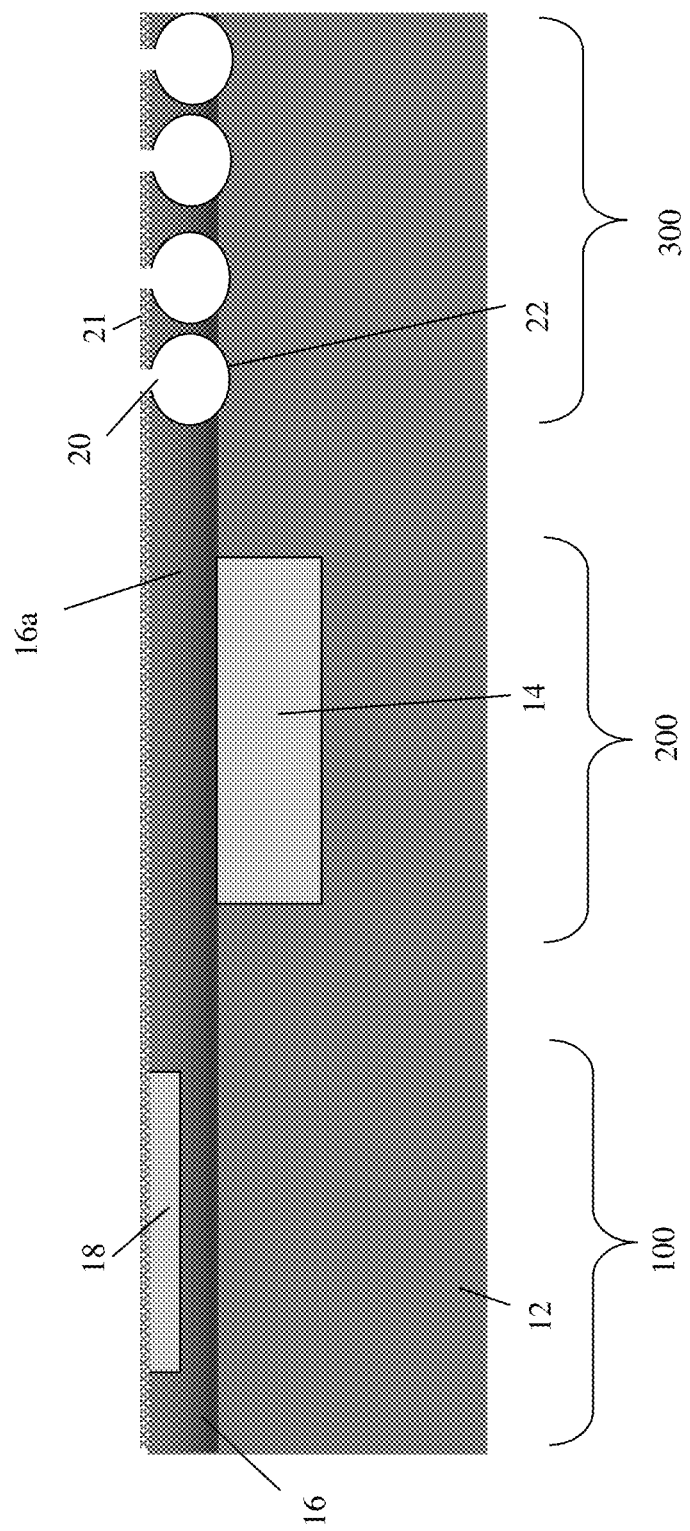
FIG. 3 shows a plurality of airgap structures (e.g., cavities) in the auto-doped region of the semiconductor material, amongst other features, and respective fabrication processes in accordance with aspects of the present disclosure.

In FIG. 3, a plurality of airgap structures (e.g., cavities) 22 can be formed in the semiconductor material 16 in the RF transistor region 300. More specifically, the plurality of airgap structures 22 are formed in the auto-doped region 16a of the semiconductor material 16. The plurality of airgap structures 22 effectively breaks up or eliminates the auto-doped region 16a thereby providing improved switching isolation for one or more RF CMOS devices of the RF transistor region 300. As described further herein, the plurality of airgap structures 22 can be single airgap structures (discontinuous) or a single, merged airgap structure (continuous).

In embodiments, the plurality of airgap structures 22 can be formed by providing a plurality of trenches 20 in the substrate 16 using conventional lithography and etching processes. For example, a resist formed over pad dielectric films 21 (which are deposited over the semiconductor material 16) can be exposed to energy (light) to form a pattern (opening). An etching process with a selective chemistry, e.g., reactive ion etching (RIE), will be used to form one or more trenches through the openings of the resist, through the pad film(s) 21 and into the semiconductor material 16. The resist can then be removed by a conventional oxygen ashing process or other known stripants.

A sidewall liner can be formed on the sidewalls of the trenches 20 by depositing a dielectric material followed by anisotropic etching process of the dielectric material from the bottom of the trenches and top planar features of the structure. In embodiments, the sidewall liner can be any suitable dielectric material(s) such as oxide or nitride or a combination of dielectric layers deposited using any known deposition method, e.g., chemical vapor deposition (CVD), thermal oxidization of the silicon substrate, atomic layer deposition (ALD) or any combinations thereof. The anisotropic etch could comprise a RIE using a perfluorocarbon-based chemistry, as is known in the art, which etches material from planar surfaces but leaves the dielectric material (e.g., sidewall liner) on the sidewall of the trenches 20.

In embodiments, the sidewall liner should robustly coat the sidewalls of the trenches 20 in order to protect the underlying semiconductor material 16 from subsequent etching processes (for cavity formation). To achieve this robust sidewall coverage, the dielectric material or materials should be thick enough to leave a film on the sidewalls of the trenches 20 but not too thick that it pinches off the top opening of the trenches 20, which would prevent cavity formation during the successive cavity etch process.

The airgap structures 22 can be formed in the semiconductor material 16 by a substrate etching process through the bottom of the trenches 20. The pad films 21 on the substrate surface and the sidewall liner of the trenches 20 protect the semiconductor material 16 from being unintentionally etched during formation of the airgap structures 22. In embodiments, prior to the formation of the airgap structures, an optional vapor or liquid HF treatment, hydrogen plasma, anneal, basic or acidic chemical clean, or any process known to remove thin or native dielectrics or residual spacer etch polymer from the semiconductor material 16 (e.g., silicon) can be used to remove any excessive dielectric material at a bottom of the trenches 20. The post sidewall liner etch cleans (e.g., anisotropic etch) should leave a robust dielectric liner, e.g., sidewall liner, on the top corner and sidewall of the trenches 20 to prevent etching of the semiconductor material 16 through the sidewall of the trenches 20 during cavity formation. In embodiments, the airgap structures 22 can extend into the underlying semiconductor material 12.

The removal of the semiconductor materials 12, 16 to form the airgap structures 22 can be by a wet etching process or dry etching process. For example, dry etchants can include plasma-based $CF_4$, plasma-based $SF_6$, or gas $XeF_4$ silicon etch, etc., and wet etching processes can include KOH and $NH_4OH$. Subsequent to the formation of the airgap structures 22, the sidewall liner and pad film(s) can be removed from the structure, exposing the upper surface of the semiconductor material 16 and the sidewalls of the trenches 20. In embodiments, the sidewall liner and pad film(s) 21 can be removed by a conventional etching process selective to such material, e.g., hot phosphorous followed by an HF chemistry or vice-versa depending on the single dielectric layer or stack of different dielectric layers used for sidewall liner.

Following the removal of the sidewall liner and pad film(s) 21, the trenches 20 can be subjected to an optional annealing process to soften or round (curve) the edges of the trenches 20. In embodiments, the annealing is provided in an $H_2$ or other hydrogen atmosphere to remove any native or other oxide from the silicon substrate surface. The annealing can also be provided in other atmospheres, e.g., $NH_3$, $B_2H_6$, $PH_3$, $AsH_2$ or other gases bonded to hydrogen. By way of one example, following an HF preclean process, the structure can undergo an annealing process at a temperature range of about 800° C. to about 1100° C., for up to about 60 seconds. If little or no curvature is required, then the annealing temperature, time, or hydrogen-based gas flow is reduced to eliminate or minimize the silicon substrate reflow.

Figure 4:
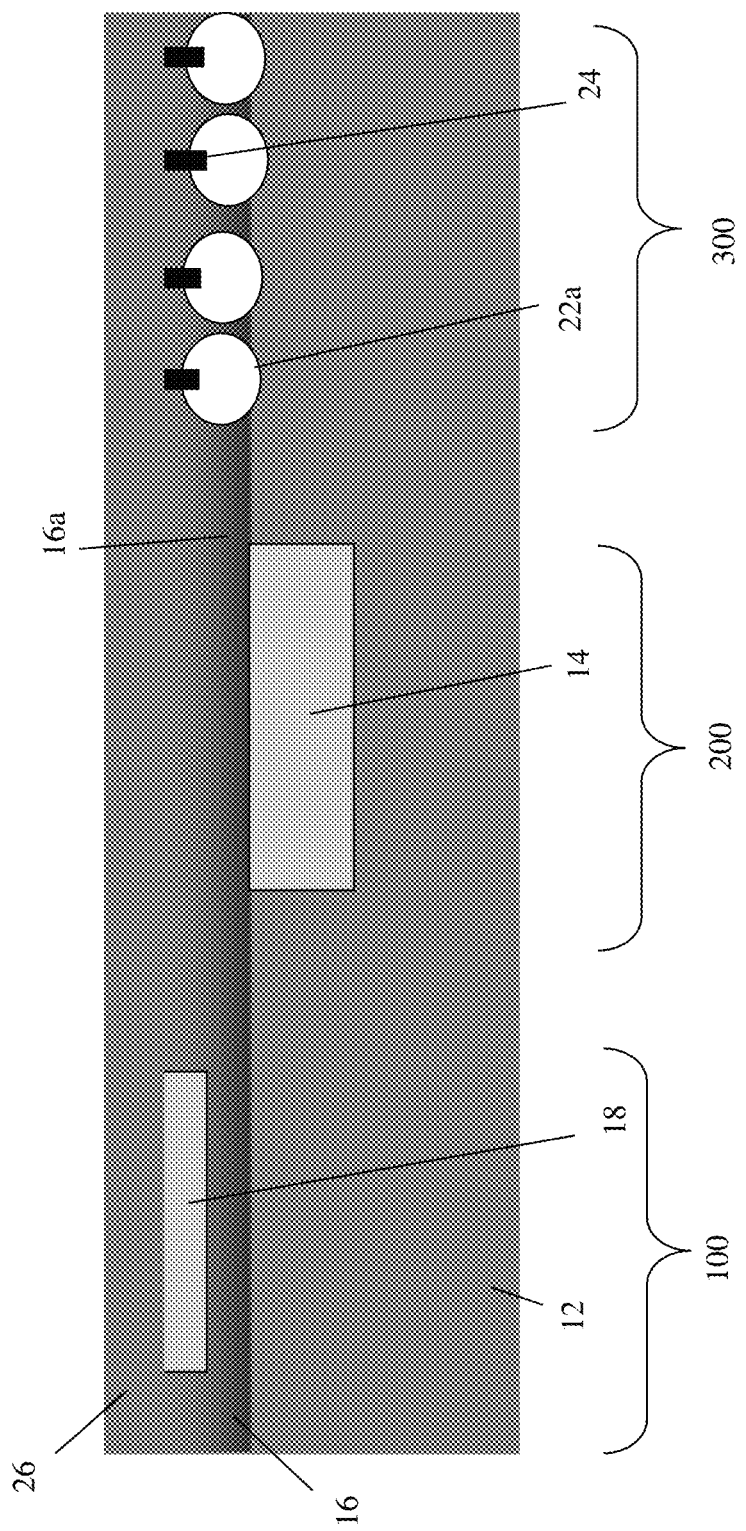
FIG. 4 shows a material sealing the airgap structures, amongst other features, and respective fabrication processes in accordance with aspects of the present disclosure.

In FIG. 4, a material 24 can be formed on the surface of the semiconductor material 16 including sidewalls of the trenches 20 and sidewalls of the cavity structure 22. In embodiments, the material 24 can be epitaxial Ge or SiGe material deposited using ultra high vacuum CVD (UHVCVD); although other semiconductor materials are also contemplated herein. In embodiments, Ge material can be deposited at a temperature of about 600° C. to 750° C., resulting in a thickness of about 5 nm to about 50 nm; although other dimensions are contemplated depending on the critical dimension of the trenches 20.

As further depicted in FIG. 4, the structure is heated to equal to or greater than the reflow temperature of the material 24 so that the material 24 fills in the top of the trenches 20. More specifically, the material 24 has a reflow temperature lower than the semiconductor materials 12, 16 so that the material 24 can reflow and seal the trenches 20 thereby forming sealed airgap structures 22a (which will disrupt or eliminate the auto-doped region 16a under the RF CMOS devices). For example, Ge has a lower reflow temperature than Si such that the Ge can be reflowed into the opening of the trenches 20 to seal the top of the trenches 20 without filling in the sealed airgap structures 22a. In embodiments, the reflow temperature can be about 800° C. to 1050° C. and the reflow time can be anywhere up to about 600 seconds.

After the material 24 is reflowed, another semiconductor material 26 can be deposited over the trenches 20 and material 24. In embodiments, the semiconductor material 26 can be single crystalline Si material, as an example, with the sealed airgap structures 22a being contiguous with the formation of the semiconductor material 26. The semiconductor material 26 can be epitaxially grown over the semiconductor material 16 to a thickness of 0.4 µm or greater in a deposition chamber having a temperature of about 850° C. to about 1050° C. for about 60 seconds. At this temperature, the material 24 can continue to reflow and continue to gravitate or migrate into the upper portion of the trenches 20 (e.g., typically at the smallest critical dimension). In embodiments, the surface of the semiconductor material 26 can grow in a self-planarized fashion, e.g., have a flat surface. Also, the semiconductor material 26 can be used to further seal the airgap structures 22a.

Figure 5:
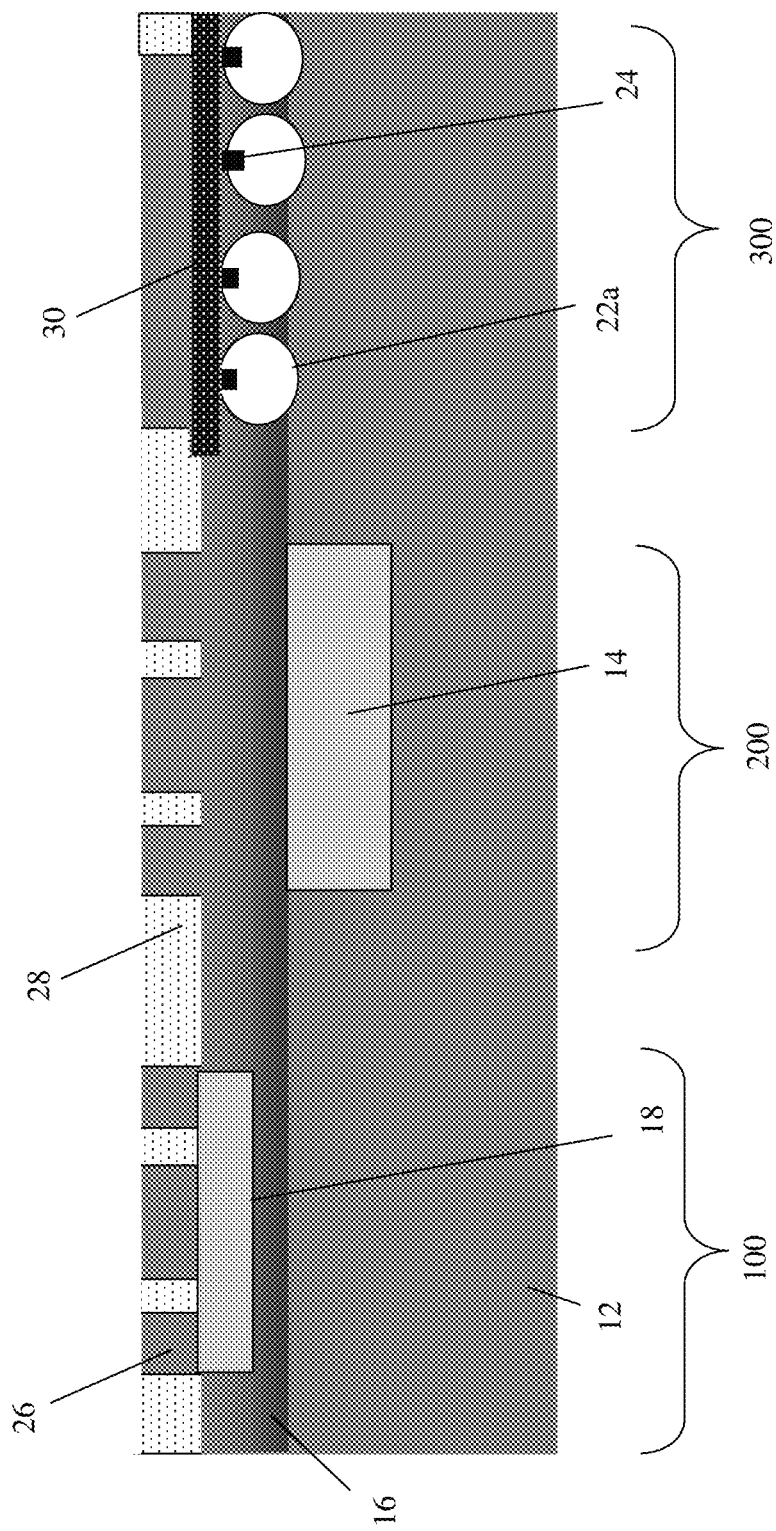
FIG. 5 shows shallow trench isolation structures above the sealed airgap structures, amongst other features, and respective fabrication processes in accordance with aspects of the present disclosure.

In FIG. 5, shallow trench isolation structures 28 are formed in the semiconductor material 26, in regions 100, 200, 300. In embodiments, the shallow trench isolation structures 28 can isolate the separate devices in the different regions 100, 200, 300. The shallow trench isolation structures 28 can be formed by conventional lithography and etching processes as described above, followed by a deposition of insulator material. For example, following the etching and resist removal, insulator material, e.g., $SiO_2$, can be deposited by any conventional deposition process, e.g., CVD, in the shallow trenches formed by the etching process. Any residual material on the surface of the semiconductor material 26 can be removed by conventional chemical mechanical polishing (CMP) processes.

FIG. 5 further shows an amorphous semiconductor region 30 formed in the semiconductor material 26, vertically above the airgap structures 22a in region 300. In embodiments, the amorphous semiconductor region 30 can be polysilicon material formed by using an implant process with an implant mask followed by an anneal. For example, the implant can be argon or other noble gas, e.g., Xe, Kr, etc. In embodiments, the amorphous semiconductor region 30 can be a high resistance semiconductor region which provides further isolation underneath RF devices in region 300. The amorphous semiconductor region 30 can be provided below the shallow trench isolation regions 28.

Figure 6:
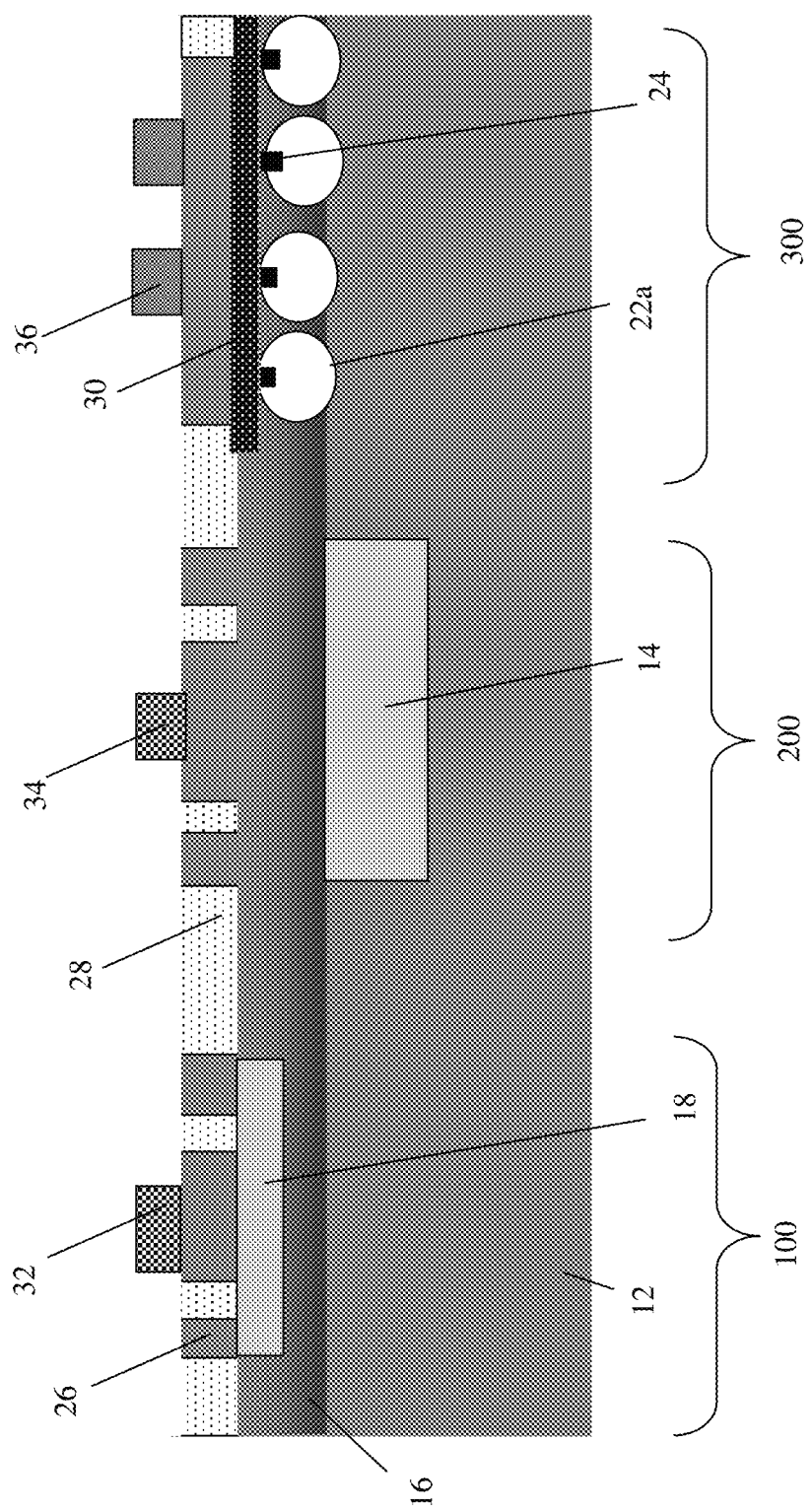
FIG. 6 shows RF devices above the sealed airgap structures, amongst other features, and respective fabrication processes in accordance with aspects of the present disclosure.

In FIG. 6, bipolar junction transistors 32, 34 can be formed in respective regions 100, 200 and RF switches 36, e.g., RF CMOS devices, can be formed in region 300. In embodiments, the RF switches 36 can be vertically above the amorphous semiconductor region 30 and the airgap structures 22a. In a non-limiting illustrative example, the bipolar junction transistor 32 can be a 5V high performance transistor and the bipolar junction transistor 34 can be a 20V high breakdown transistor (e.g., 20V BVcbo (breakdown voltage, collector-emitter, base open)); although other parameters are contemplated herein.

Although not critical to the understanding of the present disclosure, the RF switches 36 can be fabricated using standard CMOS or replacement gate processes. In the standard CMOS processing, a gate dielectric and polysilicon material are formed, e.g., deposited, onto the semiconductor material 26, followed a patterning process. An insulator material such as nitride or oxide can be deposited on the patterned materials, followed by an anisotropic etching process to form sidewall spacers. The gate dielectric can be a low-k dielectric material, e.g., gate oxide, or high-k dielectric material, e.g., hafnium oxide based material. The source and drain regions for the RF switches 36 can be formed by a conventional epitaxial process for raised source/drain regions or through ion implantation process, each of which are known to those of skill in the art such that no further explanation is required herein for a complete understanding of the present disclosure.

The bipolar junction transistors can be a high performance bipolar junction transistor 32 in region 100 and a high breakdown bipolar junction transistor 34 in region 200. It should be understood that the high performance bipolar junction transistor 32 can be an optional device. In any scenario, the bipolar junction transistors 32, 34 can be formed by depositing a base material, e.g., p-doped polysilicon material, and emitter material, e.g., an n-doped Si material or SiGe material, on the semiconductor material 26. The materials are then patterned using conventional lithography and etching processes as is known in the art. The collector region comprises the semiconductor material 26, with the n-well 18 being a sub-collector for the high performance bipolar junction transistor 32 and the n-well 14 being a sub-collector for the high breakdown bipolar junction transistor 34. As should be understood by those of skill in the art, the n-well 18 should be closer to the surface for improved frequency; whereas, the n-well 14 should be deeper into the substrate 12 for improved breakdown.

Figure 7:
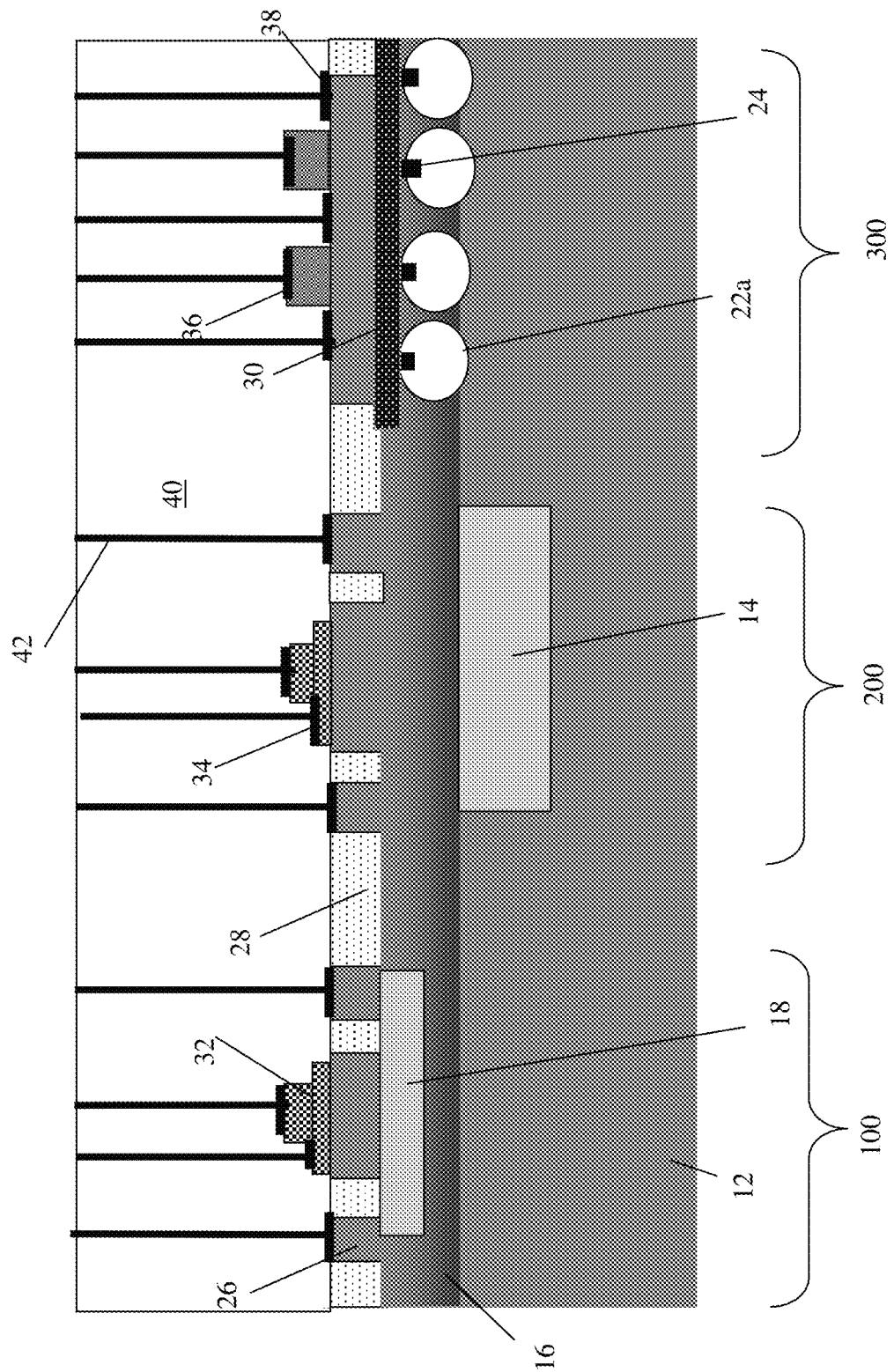
FIG. 7 shows contacts to different devices, amongst other features, and respective fabrication processes in accordance with aspects of the present disclosure.

As shown in FIG. 7, the devices 32, 34, 36 can undergo a silicide process to form silicide contacts 38. As should be understood by those of skill in the art, the silicide process begins with deposition of a thin transition metal layer, e.g., nickel, cobalt or titanium, over fully formed and patterned semiconductor devices (e.g., source/drain regions and respective active portions of the devices 32, 34, 36). After deposition of the material, the structure is heated allowing the transition metal to react with exposed silicon (or other semiconductor material as described herein) in the active regions of the devices forming a low-resistance transition metal silicide contact 38. Following the reaction, any remaining transition metal can be removed by chemical etching, leaving the silicide contacts 38. It should be understood by those of skill in the art that silicide contacts will not be required on all features.

An interlevel dielectric material 40 can be formed over the silicide contacts 38 and devices 32, 34, 36. In embodiments, the interlevel dielectric material 40 can be an oxide material, e.g., SiO$_2$, or bilayer stack of material, e.g., nitride material with undoped insulator material or Phosphosilicate (PSG)/Boron PSG (BPSG), deposited using conventional deposition processes known to those of skill in the art. The contacts 42 can be formed by conventional lithography, etching and deposition methods known in the art. Contacts 42 can be formed to each of the devices 32, 34, 36, e.g., gate structures, silicide and/or unsilicided NPN structures. The contacts 42 can be formed by conventional lithography, etching and deposition processes known to those of skill in the art. In embodiments, the contacts 42 comprise aluminum, tungsten or other appropriate metals or metal alloys.

Figure 8:
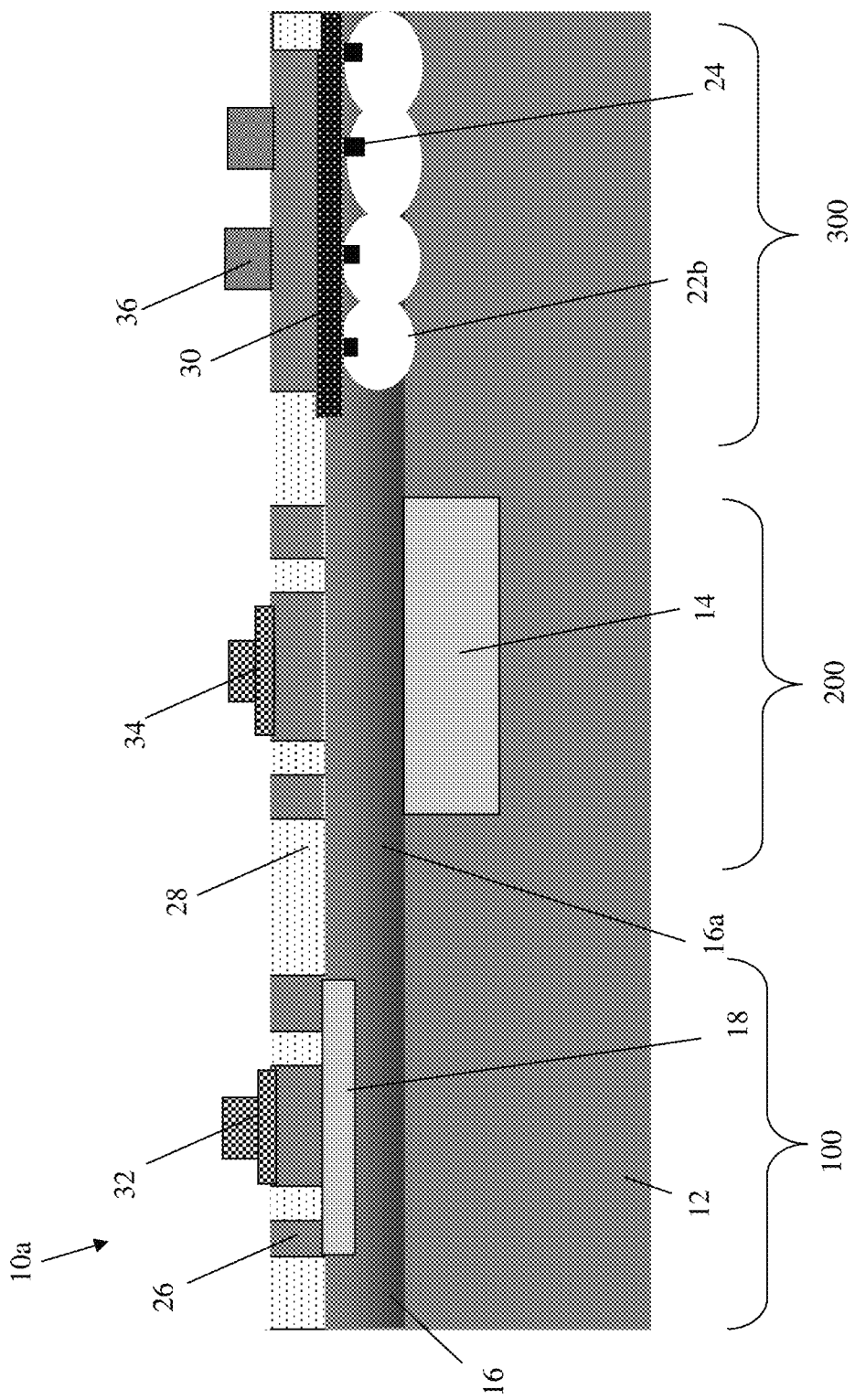
FIG. 8 shows an alternative structure with a continuous airgap structure under one or more RF devices, amongst other features, and respective fabrication processes in accordance with aspects of the present disclosure.

FIG. 8 shows an alternative structure 10a in accordance with aspects of the present disclosure. In this alternative structure 10a, the airgap structures are merged together to form a single, larger airgap structure 22b (i.e., continuous airgap structure 22b) in region 300. In embodiments, the single, larger airgap structure 22b can be formed by a continuation of the etching process that forms the discrete airgap structures. The single, larger airgap structure 22b can eliminate or break up the auto-doped region 16a, effectively providing additional isolation for the RF devices 36 in region 300. The remaining features of the structure 10a are similar to that described with reference to FIG. 7.

Figure 9:
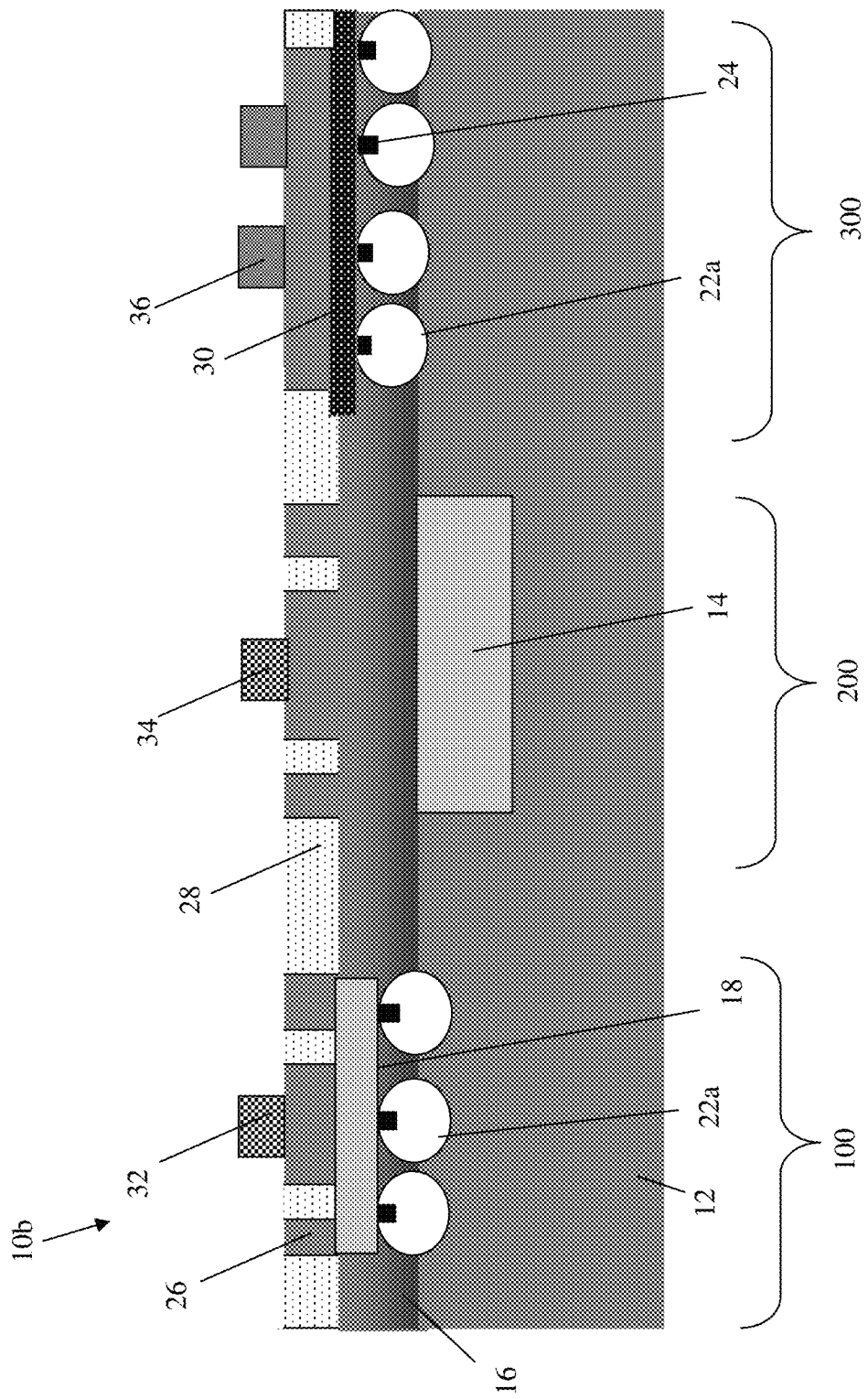
FIG. 9 shows an alternative structure with airgap structures under a high performance bipolar junction device, amongst other features, and respective fabrication processes in accordance with aspects of the present disclosure.

FIG. 9 shows an alternative structure 10b in accordance with aspects of the present disclosure. In this alternative structure 10b, the airgap structures 22a are provided within the auto-doped region 16a in region 100 and region 300. More specifically, in this embodiment, the airgap structures 22a are provided within the auto-doped region 16a, under the high performance bipolar junction device 32. The airgap structures 22a are also provided under the n-well 18. It should be understood that the airgap structures 22a can also be a single, merged airgap structure as noted in FIG. 8, and that any combination of individual airgap structures (discontinuous) and/or a single, merged airgap structure (continuous) are contemplated herein. The remaining features of the structure 10b are similar to that described with reference to FIGS. 7 and 8.

Figure 10:
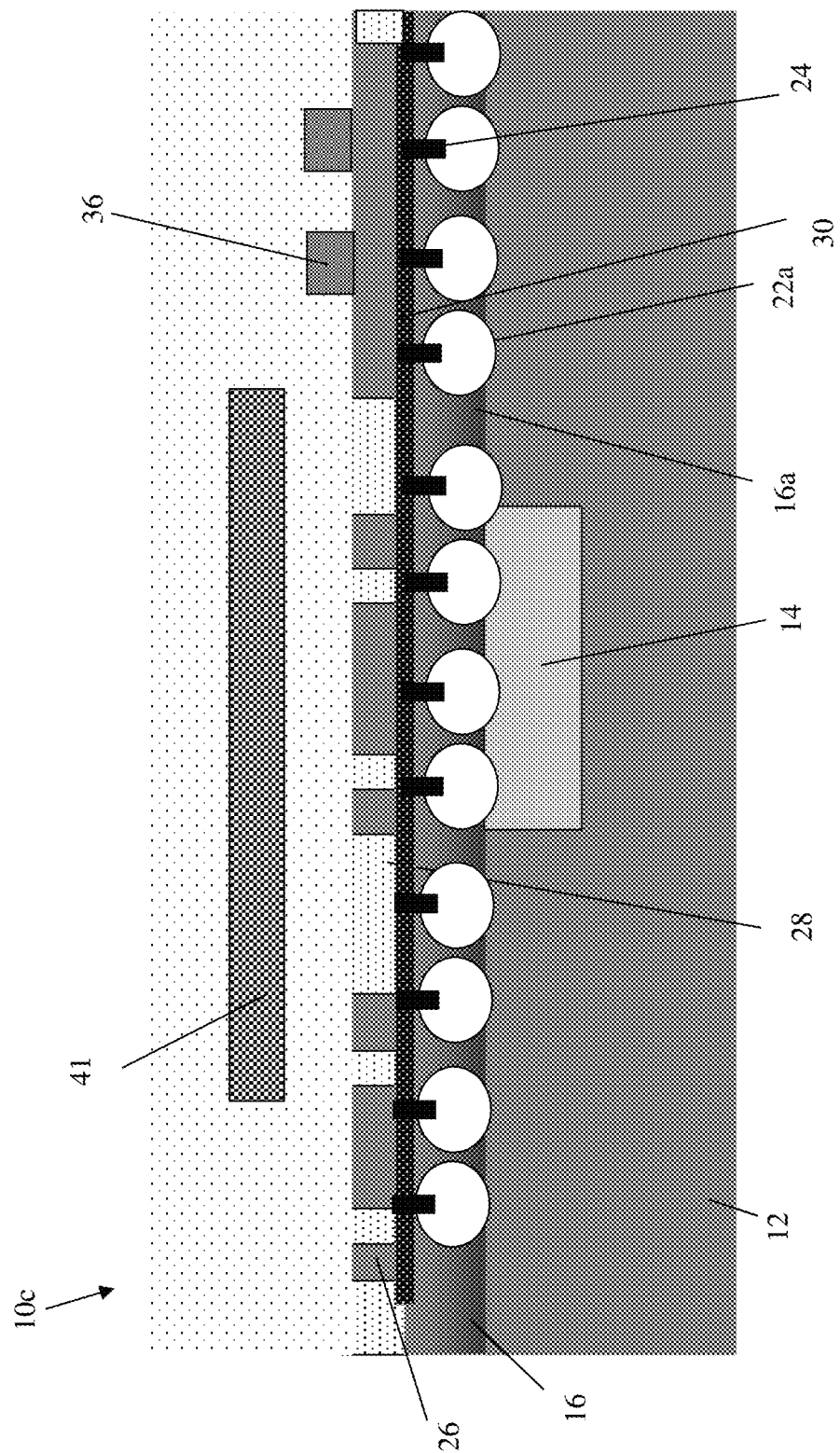
FIG. 10 shows an alternative structure with airgap structures below passive devices, amongst other features, and respective fabrication processes in accordance with aspects of the present disclosure.

FIG. 10 shows an alternative structure 10c in accordance with aspects of the present disclosure. In this alternative structure 10c, passive devices 41 are formed in a back end of the line dielectric material 38. In embodiments, the passive devices 41 can be resistors, inductors, capacitors, etc., formed using conventional CMOS processes such that no further explanation is required herein for a complete understanding of the present disclosure. In this structure 10c, the airgap structures 22a are provided within the auto-doped region 16a under the passive devices 41. It should be recognized that the airgap structures 22a can also be a single, merged airgap structure as noted in FIG. 8, and that any combination of airgap structures are contemplated herein. In addition, the amorphous region 30 can be extended to be underneath the passive devices 41 for additional isolation to improve the Q (quality) factor for the passive devices 41. The remaining features of the structure 10c are similar to that described with reference to FIGS. 7-9.

The semiconductor structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a semiconductor material comprising a doped region;
    one or more sealed airgap structures breaking up the doped region of the semiconductor material;
    a second semiconductor material over the doped region of the semiconductor material and over the one or more sealed airgap structures;
    shallow trench isolation regions in the second semiconductor material and above the one or more sealed airgap structures; and
    a field effect transistor over the one or more sealed airgap structures and the second semiconductor material,
    wherein the one or more sealed airgap structures are sealed with another semiconductor material, the second semiconductor material is above the other semiconductor material, and a first n-well is below the doped region of the semiconductor material in an underlying semiconductor substrate and below the one or more sealed airgap structures.

2. The structure of claim 1, wherein the doped region comprises an n-type dopant and the shallow trench isolation regions are entirely in the second semiconductor material and entirely above the one or more sealed airgap structures.

3. The structure of claim 1, wherein the one or more sealed airgap structures comprise discontinuous sealed airgap structures under the field effect transistor.

4. The structure of claim 1, wherein the one or more sealed airgap structures comprise a single continuous sealed airgap structure under the field effect transistor.

5. The structure of claim 1, wherein the one or more sealed airgap structures eliminate the doped region under the field effect transistor.

6. The structure of claim 1, further comprising an amorphous semiconductor material vertically between the field effect transistor and the one or more sealed airgap structures, the one or more sealed airgap structures being plural sealed airgap structures and the amorphous semiconductor extending between the plural sealed airgap structures and contacting to another semiconductor material that seals the plural sealed airgap structures.

7. The structure of claim 6, wherein the amorphous semiconductor material is below the shallow trench isolation regions formed in the second semiconductor material and the second semiconductor material comprises source and drain regions of the field effect transistor.

8. The structure of claim 1, further comprising a second n-well in the second semiconductor material above the one or more sealed airgap structures.

9. The structure of claim 1, wherein the one or more sealed airgap structures are below passive devices.

10. The structure of claim 1, wherein the one or more sealed airgap structures are below a high performance bipolar junction transistor and a second n-well in the second semiconductor substrate is above the one or more sealed airgap structures.

11. The structure of claim 1, further comprising a high breakdown bipolar junction transistor wherein the n-well below the doped region of the semiconductor material is remote from the one or more sealed airgap structures, and the high breakdown bipolar junction transistor being on a side of the one or more sealed airgap structures.

12. A structure comprising:
    a bipolar junction transistor comprising at least a sub-collector within an underlying substrate, the sub-collector comprising an n-well within the underlying substrate;
    a semiconductor material over the sub-collector comprising a doped region, the doped region being above the sub-collector;
    an active device over the semiconductor material; and
    at least one airgap structure below the active device and within the doped region of the semiconductor material, the at least one airgap structure being remote from the sub-collector.

13. The structure of claim 12, further comprising polysilicon material vertically between the at least one airgap structure and the active device, the polysilicon material also extends between plural of the at least one sealed airgap structure and contacts to a semiconductor material that seals the plural sealed airgap structures.

14. The structure of claim 13, wherein the polysilicon material is below shallow trench isolation regions formed in a semiconductor layer comprising source and drain regions of the active device, the semiconductor layer is above the doped region and entirely above the at least one sealed airgap structure and the shallow trench isolation regions are entirely in the semiconductor layer.

15. The structure of claim 12, wherein the at least one airgap structure comprises discontinuous sealed airgap structures under the active device and a bottom of the doped region directly contacts a top surface of the sub-collector.

16. The structure of claim 12, wherein the at least one airgap structure comprises a single continuous sealed airgap structure under the active device.

17. The structure of claim 12, wherein the at least one airgap structure is below passive devices.

18. The structure of claim 12, wherein the at least one airgap structure is below a high performance bipolar junction transistor and the semiconductor material having the doped region comprises a same dopant type as the sub-collector and further comprising a second n-well in second semiconductor above the at least one airgap structure.

19. The structure of claim 12, wherein the active device comprises a RF switching device and the bipolar junction transistor comprises a high breakdown bipolar junction transistor with the sub-collector and the doped region comprising a same dopant type.

20. A method comprising:
    forming a semiconductor material comprising a doped region;
    forming one or more sealed airgap structures breaking up the doped region of the semiconductor material;
    forming a second semiconductor material over the doped region of the semiconductor material and over the one or more sealed airgap structures;

forming shallow trench isolation regions in the second semiconductor material and above the one or more sealed airgap structures; and forming a field effect transistor over the one or more sealed airgap structures and the semiconductor material, wherein the one or more sealed airgap structures are sealed with another semiconductor material, the second semiconductor material is above the other semiconductor material, and a first n-well is formed below the doped region of the semiconductor material in an underlying semiconductor substrate and below the one or more sealed airgap structures.

* * * * *